US008569950B2

(12) United States Patent
Joo et al.

(10) Patent No.: US 8,569,950 B2
(45) Date of Patent: Oct. 29, 2013

(54) LIGHT EMITTING DISPLAY DEVICE AND METHOD FOR FABRICATING THE SAME

(75) Inventors: Young-Cheol Joo, Suwon-si (KR);
Kwan-Hee Lee, Suwon-si (KR);
Seung-Yong Song, Suwon-si (KR);
Jong-Hoon Son, Suwon-si (KR);
Young-Seo Choi, Suwon-si (KR)

(73) Assignee: Samsung Display Co., Ltd. (KR)

( * ) Notice: Subject to any disclaimer, the term of this patent is extended or adjusted under 35 U.S.C. 154(b) by 399 days.

(21) Appl. No.: 12/214,010

(22) Filed: Jun. 16, 2008

(65) Prior Publication Data

US 2009/0058294 A1 Mar. 5, 2009

(30) Foreign Application Priority Data

Sep. 5, 2007 (KR) ........................ 10-2007-0089934

(51) Int. Cl.
*H05B 33/04* (2006.01)
(52) U.S. Cl.
USPC .......................................... 313/512; 313/498
(58) Field of Classification Search
USPC ............... 257/40, 72, 98–100, 642–643, 759;
313/498–512; 315/169.1, 169.3;
427/58, 64, 66, 532–535, 539;
428/690–691, 917; 438/26–29, 34, 82;
445/24–25
See application file for complete search history.

(56) References Cited

U.S. PATENT DOCUMENTS

| 5,804,917 | A * | 9/1998 | Takahashi et al. ............ 313/504 |
| 7,564,067 | B2 * | 7/2009 | Cok ................................. 257/81 |
| 2005/0140281 | A1 * | 6/2005 | Park ............................... 313/505 |
| 2005/0255616 | A1 * | 11/2005 | Childs et al. ..................... 438/22 |
| 2006/0113900 | A1 * | 6/2006 | Oh ................................. 313/504 |
| 2007/0075316 | A1 * | 4/2007 | Yamazaki et al. .............. 257/72 |
| 2007/0194304 | A1 * | 8/2007 | Zu et al. ........................... 257/40 |

FOREIGN PATENT DOCUMENTS

| JP | 05-089959 A | 4/1993 |
| JP | 09-035868 A | 2/1997 |
| JP | 11-224773 A | 8/1999 |
| JP | 2001-155855 A | 6/2001 |
| JP | 2003-229250 | 8/2003 |
| KR | 10-2005-0030296 | 3/2005 |
| KR | 2005-0030296 | * 3/2005 |
| KR | 100685853 B1 | 2/2007 |
| KR | 100688790 B1 | 2/2007 |
| KR | 100703457 B1 | 3/2007 |

OTHER PUBLICATIONS

Webster's New World dictionary of the American Language, 1979, William Collins Publishers, Second College Edition, p. 460.*

* cited by examiner

*Primary Examiner* — Donald Raleigh
(74) *Attorney, Agent, or Firm* — Knobbe Martens Olson & Bear, LLP

(57) ABSTRACT

Disclosed are a light emitting display device and a method for fabricating the same. The light emitting display device according to the present embodiments includes a first substrate including a pixel region and a non-pixel region surrounding the pixel region; a plurality of light emitting diodes disposed in the pixel region of the first substrate, and each including a first electrode, a light emitting layer, and a second electrode; and a second substrate disposed to face the first substrate. Also, the light emitting display device according to the present embodiments includes a sealant by coupling the first substrate to the second substrate to encapsulate the pixel region; and a spacer disposed between the first substrate and the second substrate and provided in a non-light emission region arranged between the adjacent light emitting diodes. In this case, the spacer is disposed on the second electrode of the non-light emission region to be in contact with the second substrate.

4 Claims, 4 Drawing Sheets

LIGHT EMITTING DISPLAY DEVICE AND METHOD FOR FABRICATING THE SAME

CROSS-REFERENCE TO RELATED APPLICATION

This application claims priority to and the benefit of Korean Patent Application No. 10-2007-0089934 filed on Sep. 5, 2007 in the Korean Intellectual Property Office, the entire content of which is incorporated herein by reference.

BACKGROUND OF THE INVENTION

1. Field of the Invention

The present embodiments relate to a light emitting display device capable of decreasing in thickness, and a method for fabricating the same.

2. Description of the Related Art

An organic light emitting display device emits light by electrically exciting a fluorescent organic compound. Such organic light emitting display device is attracting attention as a next-generation of display device since it is driven at a low voltage and easily manufactured in small and slim scales, and also has a wide viewing angle, short response time, etc.

An organic light emitting display device includes a first substrate; at least one organic light emitting diode deposited on the first substrate; a second substrate coupled to the first substrate to encapsulate the organic light emitting diode; and a sealant for coupling the first substrate to the second substrate.

The second substrate has the form of a cavity having grooves formed therein, thereby spacing the first substrate and the second substrate from each other. An inner surface of the second substrate is spaced apart from the first substrate due to a stepped part formed on the outside of the second substrate, and therefore the distance therebetween becomes further. Accordingly, the overall thickness of the organic light emitting display device is increased. To form the cavity-shaped second substrate, grooves are formed on a flat glass using an etching solution (HF), which causes increases in fabrication cost and processing time. The embodiments described herein overcome the problems described above as well as provide additional advantages.

SUMMARY OF THE INVENTION

The present embodiments solve drawbacks of the prior art, and therefore an object of the present embodiments is to provide a light emitting display device including a second substrate which is not formed with grooves in order to reduce the thickness of the light emitting display device, and a method for fabricating the same.

Another object of the present embodiments is to provide a light emitting display device in which the uppermost layer of the first substrate is coupled to a second substrate so as to prevent a Newton's ring phenomenon that may occur as the distance between the second substrate and the first substrate becomes closer when the second substrate is formed in the form of a plate, and a method for fabricating the same.

One embodiment relates to a light emitting display device including a first substrate including a pixel region and a non-pixel region surrounding the pixel region; a plurality of light emitting diodes disposed in the pixel region of the first substrate, and each including a first electrode, a light emitting layer, and a second electrode; a second substrate disposed to face the first substrate; a sealant coupling the first substrate to the second substrate to encapsulate the pixel region; and a spacer disposed between the first substrate and the second substrate and provided in a non-light emission region arranged between adjacent light emitting diodes. In this case, the spacer being disposed on the second electrode of the non-light emission region to be in contact with the second substrate.

Another embodiment relates to a light emitting display device including a first substrate including a pixel region and a non-pixel region surrounding the pixel region; a plurality of light emitting diodes disposed in the pixel region of the first substrate, and each including a first electrode, a light emitting layer, and a second electrode; a second substrate disposed to face the first substrate; a sealant coupling the first substrate to the second substrate to encapsulate the pixel region; and a spacer disposed between the first substrate and the second substrate and provided in a non-light emission region arranged between adjacent light emitting diodes. In this case, the spacer may be disposed between a pixel definition layer of the non-light emission region and the second electrode, and the second electrode may be in contact with the second substrate.

Still another embodiment relates to a light emitting display device including a first substrate including a pixel region and a non-pixel region surrounding the pixel region; a thin film transistor disposed on the first substrate; an overcoat layer disposed on the thin film transistor; a plurality of light emitting diode disposed on the pixel region of the first substrate and including a first electrode, a light emitting layer, and a second electrode which are electrically coupled to the thin film transistor through viaholes formed on the overcoat layer; a second substrate disposed to face the first substrate; a sealant coupling the first substrate to the second substrate to encapsulate the pixel region; and a spacer disposed between the first substrate and the second substrate and provided in a non-light emission region arranged between adjacent light emitting diodes. In this case, the spacer may be disposed on the overcoat layer of the non-light emission region, and the second electrode may be in contact with the second substrate.

BRIEF DESCRIPTION OF THE DRAWINGS

The accompanying drawings, together with the specification, illustrate exemplary embodiments, and, together with the description, serve to explain the principles of the present embodiments.

DETAILED DESCRIPTION OF PREFERRED EMBODIMENTS

Figure 1:
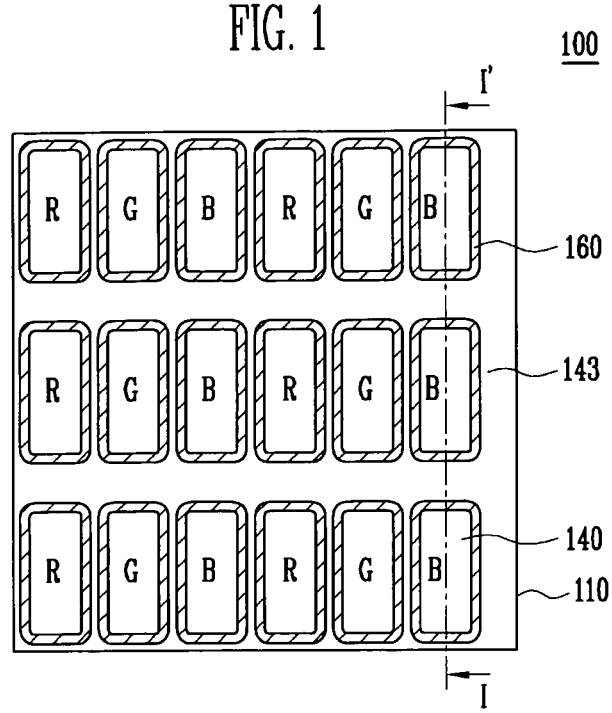
FIG. 1 is a plane view schematically showing a pixel array of an organic light emitting display device according to a first exemplary embodiment.

In the following detailed description, only certain exemplary embodiments have been shown and described, simply by way of illustration. As those skilled in the art would realize, the described embodiments may be modified in various different ways, all without departing from the spirit or scope of the present embodiments. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Figure 2:
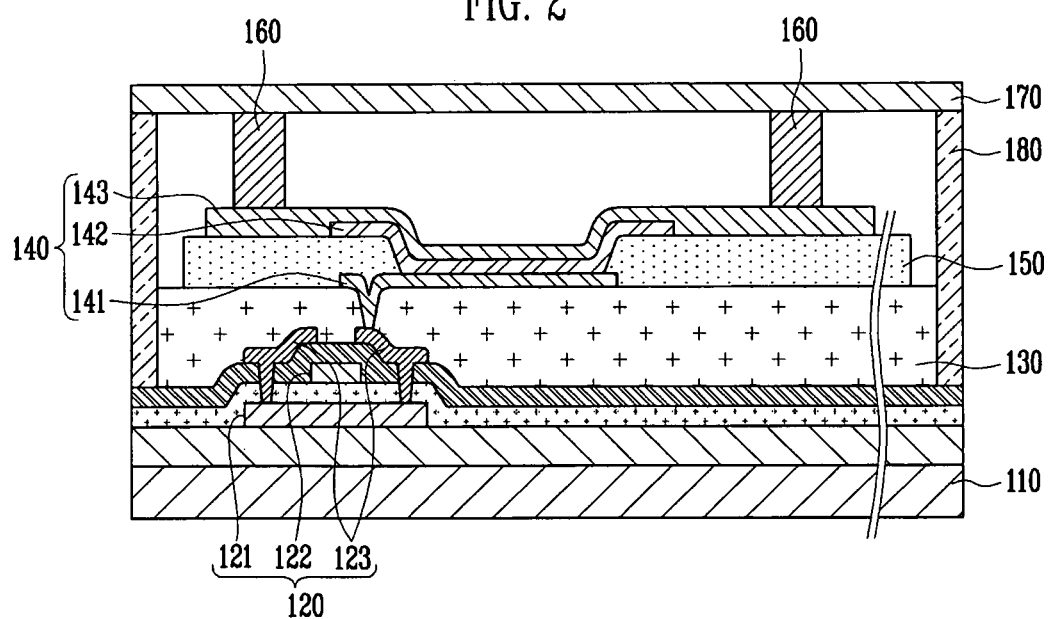
FIG. 2 is a cross-sectional view taken along line I-I' in FIG. 1.

FIG. 1 is a plan view schematically showing a pixel array of an organic light emitting display device according to a first exemplary embodiment. FIG. 2 is a cross-sectional view taken along line I-I' in FIG. 1.

Referring to FIGS. 1 and 2, the organic light emitting display device 100 according to the present embodiments includes a first substrate 110; a plurality of light emitting diodes 140 formed in a pixel region of the first substrate 110; and a second substrate 170 disposed to face the first substrate 110. Also, the organic light emitting display device 100 according to the present embodiments includes a sealant 180 for coupling the first substrate 110 with the second substrate 170; and a spacer 160 disposed between the first substrate 110 and the second substrate 170 and provided in a non-light emission region disposed between adjacent light emitting diodes 140.

The first substrate 110 includes a pixel region and a non-pixel region. The pixel region is a region that realizes light emitted from the organic light emitting diode 140 into a predetermined image. The non-pixel region refers to the rest of the regions on the first substrate 110 except for the pixel region. Also, the pixel region includes a non-light emission region disposed between adjacent organic light emitting diodes 140.

The thin film transistor 120 is disposed on the first substrate 110 and includes a semiconductor layer 121, a gate electrode 122, and a source/drain electrode 123. An overcoat layer 130 is formed throughout the first substrate 110 on which the thin film transistor 120 is formed. Also, the organic light emitting diodes 140 electrically coupled to the thin film transistor 120 are disposed on the overcoat layer 130 through viaholes.

The organic light emitting diode 140 includes a first electrode 141, a light emitting layer 142, and a second electrode 143. The first electrode 141 is disposed on the overcoat layer 130 and can be electrically coupled to the thin film transistor 120. A pixel definition layer 150 is disposed on the overcoat layer 130 on which the first electrode 141 is disposed. The pixel definition layer 150 includes an opening for exposing the first electrode 141. The light emitting layer 142 is disposed on the exposed first electrode 141. The second electrode 143 is disposed throughout the pixel definition layer 150 on which the light emitting layer 142 is disposed.

In order to protect the organic light emitting diode 140 from external environments, a second substrate 170 is disposed on the first substrate 110 on which the organic light emitting diode 140 is disposed.

The second substrate 170 is manufactured with a non-etched (non-cavity) flat plate-shaped glass (alkaline-free soda glass), and the distance between the first substrate 110 and the second substrate 170 may be smaller than when the second substrate 170 is formed of an etched substrates having a cavity shape. The overall thickness of the organic light emitting display device 100 may be reduced by the decrease of the edge of the second substrate 170 in thickness. Also, the second substrate 170 in the present embodiments is formed of flat plate-shaped glass, and the cost involved in forming grooves may be reduced.

When the second substrate 170 is formed of plate-shaped glass, the distance between the second electrode 143 and the second substrate 170 is short though the entire thickness of the organic light emitting display device 100 may be decreased. When external impacts are applied to the organic light emitting display device 100, the second substrate 170 may bend toward the first substrate 110, which causes damage to the organic light emitting diode 140.

Also, a Newton's ring may occur when the first substrate 110 and the second substrate 170 are not disposed parallel. Newton's ring is a phenomenon in which a concentric pattern is formed in the second substrate 170 due to the phase difference between the first substrate 110 and the second substrate 170 when ambient light is incident to the organic light emitting display device 100. As described above, the formation of the concentric pattern in the second substrate 170 causes degraded visibility in an image and distorted screen in driving the light emitting display device.

The second substrate 170 is prevented from being bended toward the first substrate 110 by reducing the thickness of a sealant 180 and forming the spacer 160 on the second electrode 143 of the non-light emission region in the present exemplary embodiment. The spacers 160 are formed between the second substrate 170 and components formed on the first substrate 110, and contacted with the second substrate 170 to prevent a Newton's ring phenomenon.

The sealant 180 is disposed in the edge of the second substrate 170 to couple the first substrate 110 with the second substrate 170. Such a sealant 180 prevents oxygen and moisture from penetrating into the first substrate 110 on which the organic light emitting diode 140 is formed. Also, the sealant 180 may comprise at least one conventional polymer compound, for example, epoxy, acryl, photocurable, and thermosetting resins, polyimide, and inorganic materials such as frit.

The thickness of the sealant 180 corresponds to the heights of the thin films formed on the first substrate 110 so that the second substrate 170 is in contact with the spacer 160.

For example, a conventional sealant 180 has a thickness of about 10 to 12 μm, while the sealant 180 in the present exemplary embodiment has a thickness of from about 5 to about 8 μm. Therefore, there is little or no space formed between the spacer 160 and the second substrate 170 in the present exemplary embodiment. The distance between the first substrate 110 and the second substrate 170 is set to the sum of the thickness of the outskirt of the second substrate 170 and the thickness of the sealant 180. Also, the second substrate 170 is formed of flat plate-shaped glass and contacted with the spacer 160 by reducing the thickness of the sealant 180 in the present embodiment.

Also, the spacer 160 prevents the organic light emitting diode 140 from being damaged by the second substrate 170 when impacts are applied to the organic light emitting display device 100. That is to say, the spacer 160 is in contact with the second substrate 170 to prevent the second substrate 170 from being in contact with the organic light emitting diode 140. Also, the second substrate 170 is disposed in parallel to the first substrate 110 by means of the spacer 160. Therefore, it is possible to prevent a Newton's ring phenomenon in the organic light emitting display device 100. Such a spacer 160 may be formed of polyimide-based materials, and/or formed of at least one selected from the group consisting of acryl, Noblac, imide, and epoxy. Also, the spacer 160 may be formed with a variety of patterns. For example, the spacer 160 may be formed in a variety of shapes such as a closed-loop shape surrounding pixels, a cylindrical shape, an uneven shape, and a rod shape, for example.

Figure 3:
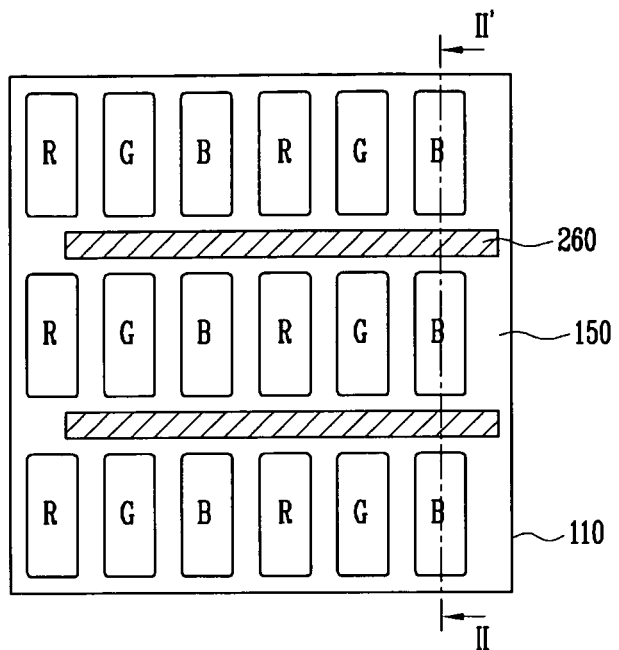
FIG. 3 is a plane view schematically showing a pixel array of an organic light emitting display device according to a second exemplary embodiment.
Figure 4:
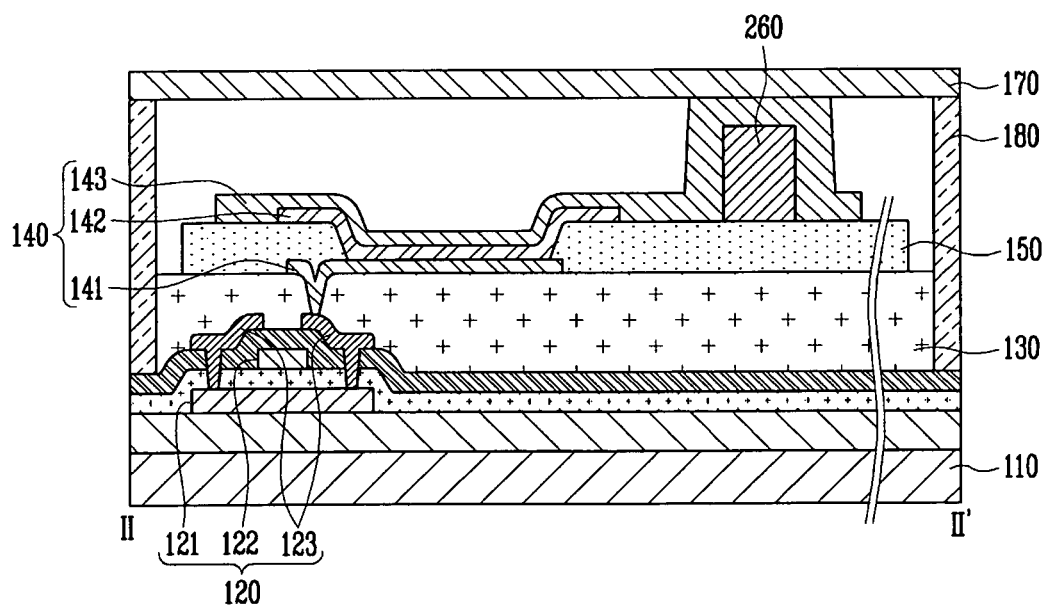
FIG. 4 is a cross-sectional view taken along line II-II' in FIG. 3.

FIG. 3 is a plane view schematically showing a pixel array of an organic light emitting display device according to a second exemplary embodiment. FIG. 4 is a cross-sectional view taken along line II-II' in FIG. 3. Referring to FIGS. 3 and 4, the second exemplary embodiment is substantially identical to the first exemplary embodiment, except that a spacer 260 is disposed on a pixel definition layer 150. In this case, a second electrode 143 formed on the spacer 260 is formed with a stepped part along the shape of the spacer 260. Therefore, a second substrate 170 is in contact with the second electrode 143 formed on the spacer 260.

Figure 5:
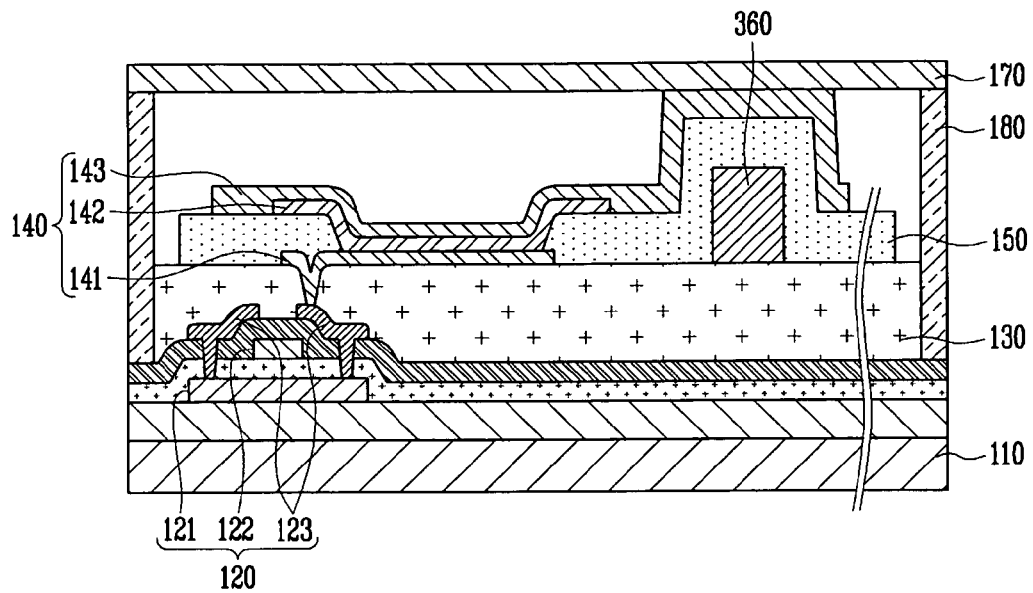
FIG. 5 is a cross-sectional view showing an organic light emitting display device according to a third exemplary embodiment.

FIG. 5 is a cross-sectional view showing an organic light emitting display device according to a third exemplary embodiment. Referring to FIG. 5, the third exemplary embodiment is substantially identical to the first exemplary embodiment, except that a spacer 360 is disposed on an overcoat layer 130. In this case, a pixel definition layer 150 and a second electrode 143 formed on the spacer 360 are formed with a stepped part along the shape of the spacer 360. Therefore, a second substrate 170 is in contact with the second electrode 143.

Figure 6:
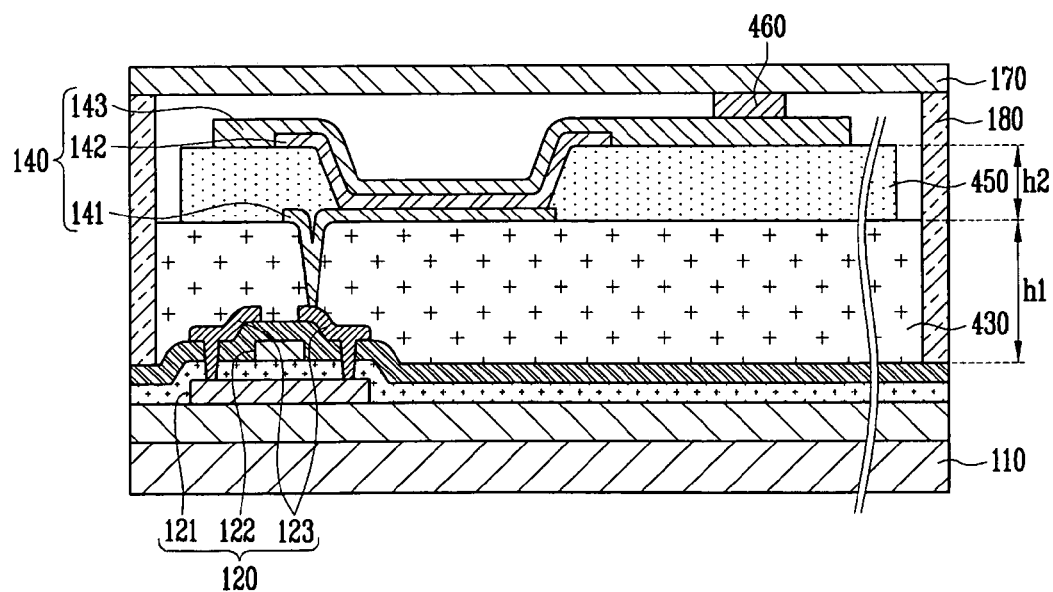
FIG. 6 is a cross-sectional view showing an organic light emitting display device according to a fourth exemplary embodiment.

FIG. 6 is a cross-sectional view showing an organic light emitting display device according to a fourth exemplary embodiment. Referring to FIG. 6, the fourth exemplary embodiment is substantially identical to the first exemplary embodiment, except that an overcoat layer 430 and a pixel definition layer 450 are formed with thicker thicknesses (h1 and h2) than a conventional overcoat layer and pixel definition layer. Therefore, a second substrate 170 is in contact with a spacer 460 although the organic light emitting display device has a spacer 460 thinner than the spacer 160 according to the first exemplary embodiment.

In the present exemplary embodiment, the second substrate 170 is in contact with the spacer 460 since the overcoat layer 430 and the pixel definition layer 450 are thicker. Alternatively, as one of the overcoat layer 430, the pixel definition layer 450, and the spacer 460 is formed thicker, the second substrate 170 may be in contact with the uppermost layer of a first substrate 110.

For example, the overcoat layer is generally formed with a thickness of 0.5 to 3 µm, while the overcoat layer may be formed with a thickness of 5 to 8.5 µm in the present embodiments. Thus, the second substrate 170 can be in contact with the uppermost layer of the first substrate 110.

Figure 7:
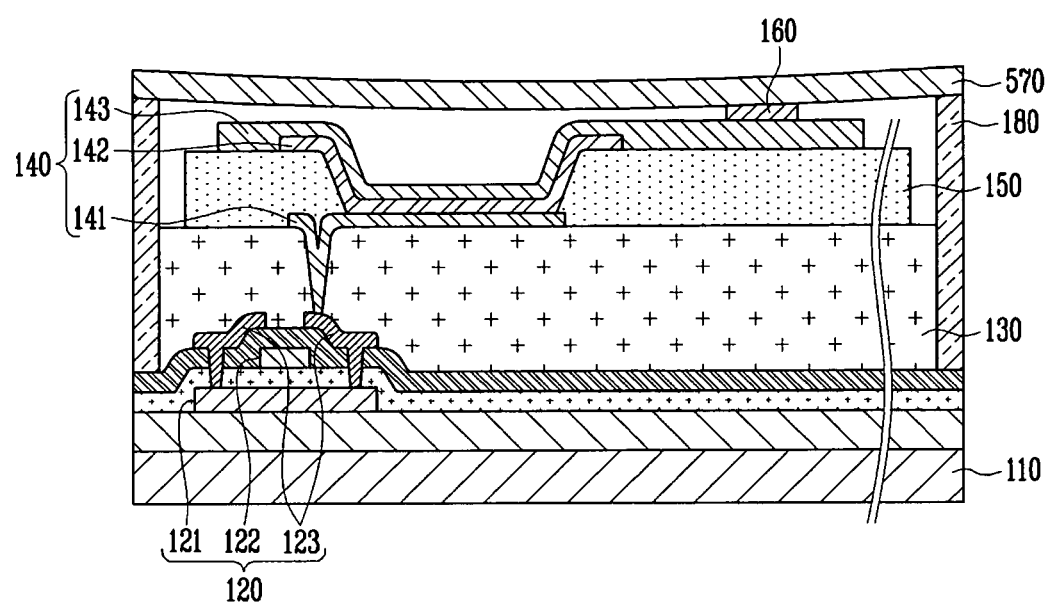
FIG. 7 is a cross-sectional view showing an organic light emitting display device according to a fifth exemplary embodiment.

FIG. 7 is a cross-sectional view showing an organic light emitting display device according to a fifth exemplary embodiment. Referring to FIG. 7, the fifth exemplary embodiment is substantially identical to the first exemplary embodiment, except that a second substrate 570 is concavely bended toward the inner part of a second electrode 143. Such formation of the second substrate 570 is carried out using a differential pressure encapsulation method, which is the same manner employed for a conventional organic light emitting display device.

A first substrate 110 and the second substrate 570 are inserted into a chamber to form the second substrate 570 concavely toward a direction of a spacer 160. Then, a pressure in the vacuum chamber is lowered to a negative pressure that is lower than the atmospheric pressure (760 torr), using a pressure controller.

Then, a sealant 180 is cured to couple the first substrate 110 with the second substrate 570. When the first substrate 110 is coupled to the second substrate 570, a pressure between the coupled first substrate 110 and second substrate 570 is maintained to a pressure that is lower than P1 by applying a physical force to the first substrate 110 and the second substrate 570. Here, the term 'P1' means a pressure between the first substrate 110 and the second substrate 570 before the exposure to the atmospheric pressure in which the first substrate 110 and the second substrate 570 exposed to the atmospheric pressure are not deformed by the change in pressure.

Then, the coupled first substrate 110 and second substrate 570 are exposed to the atmospheric pressure, so that the second substrate 570 is concavely bended toward the first substrate 110. This phenomenon occurs since gas molecules that are present between the first substrate 110 and the second substrate 570 are reduced in volume due to a pressure difference (differential pressure), e.g., the difference between the atmospheric pressure and the pressure formed between the coupled first substrate 110 and second substrate 570 when the coupled first substrate 110 and second substrate 570 are exposed to the atmospheric pressure.

Therefore, the second substrate 570 may be closely coupled to the top of the spacer 160 since the second substrate 570 is concavely bended toward the spacer 160.

Also, although the first substrate 110 and the second substrate 570 are closely coupled to each other using the sealant 180 in the present exemplary embodiment, an inorganic sealant, e.g., frit may be further formed in an inner surface of the sealant 180 to improve adhesion between the first substrate 110 and the second substrate 570. In this case, the second substrate 570 is concavely bended toward the first substrate 110, and the inorganic sealant is cured by irradiating lasers or ultraviolet rays to the inorganic sealant.

The above-mentioned embodiments have been made with an organic light emitting display device (OLED) as an illustrative example, but it is evident to those skilled in the art that the present embodiments are applicable to a liquid crystal display (LCD), a field emission display (FED), a plasma display panel (PDP), an electro luminescent display (ELD), and a vacuum fluorescent display (VFD).

According to the present embodiments, it is possible to reduce the thickness of the organic light emitting display device by forming the second substrate in the form of a plate.

Also, at least one spacer is installed in the non-light emission region arranged between adjacent pixels, and the uppermost layer of the first substrate is then coupled to the second substrate. Therefore, it is possible to prevent a Newton's ring phenomenon in the organic light emitting display device.

While the present embodiments have been described in connection with certain exemplary embodiments, it is to be understood that the present embodiments are not limited to the disclosed embodiments, but, on the contrary, is intended to cover various modifications and equivalent arrangements included within the spirit and scope of the appended claims, and equivalents thereof.

What is claimed is:

1. A light emitting display device, comprising:
a first substrate including a pixel region and a non-pixel region surrounding the pixel region;
a thin film transistor disposed on the first substrate;
an overcoat layer disposed on the thin film transistor;
a plurality of light emitting diodes disposed on the pixel region of the first substrate and including a first electrode, a light emitting layer, and a second electrode which are electrically coupled to the thin film transistor through viaholes formed on the overcoat layer;
a second substrate disposed to face the first substrate;
a sealant coupling the first substrate to the second substrate configured to encapsulate the pixel region; and a non-metallic spacer disposed between the first substrate and the second substrate provided in a non-light emission region arranged between adjacent light emitting diodes, wherein the spacer is disposed on and contacts the overcoat layer of the non-light emission region, and is distinct from and contacted on at least three sides by a pixel definition layer, and the second electrode is formed on and contacts the pixel definition layer, and the second electrode is in contact with the second substrate.

2. The light emitting display device according to claim 1, wherein the second substrate has the form of a flat plate.

3. The light emitting display device according to claim 1, wherein the second substrate is concavely formed toward a space formed by coupling the first substrate to the second substrate.

4. The light emitting display device according to claim 1, wherein the sealant is from about 5 to about 8 μm.

* * * * *